United States Patent
Hietala

(10) Patent No.: US 7,801,244 B2
(45) Date of Patent: Sep. 21, 2010

(54) AM TO AM CORRECTION SYSTEM FOR POLAR MODULATOR

(75) Inventor: Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 1300 days.

(21) Appl. No.: 10/147,579

(22) Filed: May 16, 2002

(65) Prior Publication Data

US 2003/0215026 A1    Nov. 20, 2003

(51) Int. Cl.
*H04L 25/49* (2006.01)
(52) U.S. Cl. ............... 375/296; 375/297; 375/284; 375/285
(58) Field of Classification Search ........... 375/285, 375/295, 296, 297, 271, 302, 300, 322, 284; 455/63, 67.1, 67.3, 91, 93, 115, 42, 108; 332/117, 123, 149, 155, 124
See application file for complete search history.

(56) References Cited

U.S. PATENT DOCUMENTS

| | | | |
|---|---|---|---|
| 3,900,823 A | 8/1975 | Sokal et al. | 330/149 |
| 4,389,618 A | 6/1983 | Bauman | |
| 4,609,881 A | 9/1986 | Wells | 331/1 A |
| 4,837,786 A | 6/1989 | Gurantz et al. | |
| 4,968,908 A | 11/1990 | Walls | |
| 5,055,802 A | 10/1991 | Hietala et al. | |
| 5,079,522 A | 1/1992 | Owen et al. | 331/16 |
| 5,313,411 A | 5/1994 | Tsujimoto | |
| 5,430,416 A | 7/1995 | Black et al. | 332/145 |
| 5,444,415 A | 8/1995 | Dent et al. | |
| 5,524,286 A * | 6/1996 | Chiesa et al. | 455/126 |
| 5,598,436 A | 1/1997 | Brajal et al. | 375/297 |
| 5,608,353 A | 3/1997 | Pratt | |
| 5,617,450 A | 4/1997 | Kakuishi et al. | |
| 5,629,648 A | 5/1997 | Pratt | |
| 5,822,011 A | 10/1998 | Rumreich | |
| 5,900,778 A | 5/1999 | Stonick et al. | |
| 5,952,895 A | 9/1999 | McCune, Jr. et al. | 332/128 |
| 6,008,703 A | 12/1999 | Perrott et al. | 332/100 |
| 6,101,224 A | 8/2000 | Lindoff et al. | |
| 6,115,684 A * | 9/2000 | Kawahara et al. | 704/203 |
| 6,130,579 A | 10/2000 | Iyer et al. | |
| 6,191,656 B1 | 2/2001 | Nadler | |
| 6,211,747 B1 | 4/2001 | Trichet et al. | 332/128 |
| 6,229,395 B1 | 5/2001 | Kay | |

(Continued)

OTHER PUBLICATIONS

Volder, Jack E., "The CORDIC Trigonometric Computing Technique," IRE Trans. On Elect Computers p. 330, Sep. 1959.

(Continued)

*Primary Examiner*—David C Payne
*Assistant Examiner*—Linda Wong
(74) *Attorney, Agent, or Firm*—Withrow & Terranova, P.L.L.C.

(57) ABSTRACT

A transmitter includes a polar converter to generate an amplitude signal and a phase signal, which in turn is converted to a frequency signal. The amplitude signal is directed to a compensator and a compensation signal is generated. The compensation signal is combined with the amplitude signal and the combined signal is presented to the power amplifier. The AM to AM conversion is reduced such that the output signal of the power amplifier contains substantially no spurious components.

19 Claims, 7 Drawing Sheets

U.S. PATENT DOCUMENTS

| | | | |
|---|---|---|---|
| 6,236,687 B1 | 5/2001 | Caso et al. | |
| 6,236,703 B1 | 5/2001 | Riley | 377/48 |
| 6,236,837 B1 * | 5/2001 | Midya | 455/63.1 |
| 6,240,278 B1 | 5/2001 | Midya et al. | |
| 6,246,286 B1 | 6/2001 | Persson | |
| 6,271,727 B1 | 8/2001 | Schmukler | |
| 6,275,685 B1 | 8/2001 | Wessel et al. | |
| 6,285,239 B1 | 9/2001 | Iyer et al. | |
| 6,295,442 B1 | 9/2001 | Camp, Jr. et al. | 455/102 |
| RE37,407 E | 10/2001 | Eisenberg et al. | |
| 6,307,364 B1 | 10/2001 | Augustine | |
| 6,329,809 B1 | 12/2001 | Dening et al. | |
| 6,335,767 B1 * | 1/2002 | Twitchell et al. | 348/608 |
| 6,356,150 B1 | 3/2002 | Spears et al. | |
| 6,359,950 B2 | 3/2002 | Gossmann et al. | 375/376 |
| 6,366,177 B1 * | 4/2002 | McCune et al. | 332/103 |
| 6,377,784 B2 | 4/2002 | McCune | |
| 6,392,487 B1 | 5/2002 | Alexanian | |
| 6,462,617 B1 | 10/2002 | Kim | |
| 6,504,885 B1 | 1/2003 | Chen | |
| 6,522,121 B2 | 2/2003 | Coumou | |
| 6,581,082 B1 | 6/2003 | Opsahl | |
| 6,642,786 B1 | 11/2003 | Jin et al. | |
| 6,693,468 B2 | 2/2004 | Humphreys et al. | |
| 6,700,929 B1 | 3/2004 | Shan et al. | |
| 6,701,134 B1 | 3/2004 | Epperson | |
| 6,701,138 B2 | 3/2004 | Epperson et al. | |
| 6,720,831 B2 | 4/2004 | Dening et al. | |
| 6,724,252 B2 | 4/2004 | Ngo et al. | |
| 6,724,265 B2 | 4/2004 | Humphreys | |
| 6,724,831 B1 * | 4/2004 | Hasegawa et al. | 375/297 |
| 6,728,324 B1 | 4/2004 | Shan et al. | |
| 6,731,145 B1 | 5/2004 | Humphreys et al. | |
| 6,735,419 B2 * | 5/2004 | Mitzlaff | 455/127.1 |
| 6,748,204 B1 | 6/2004 | Razavi et al. | |
| 6,782,244 B2 | 8/2004 | Steel et al. | |
| 6,798,843 B1 | 9/2004 | Wright et al. | |
| 6,801,086 B1 * | 10/2004 | Chandrasekaran | 330/140 |
| 6,807,406 B1 | 10/2004 | Razavi et al. | |
| 6,816,718 B2 | 11/2004 | Yan et al. | |
| 6,819,914 B1 | 11/2004 | Yan et al. | |
| 6,819,941 B2 | 11/2004 | Dening et al. | |
| 6,831,506 B1 | 12/2004 | Moffat et al. | |
| 6,834,084 B2 | 12/2004 | Hietala | |
| 6,836,517 B2 * | 12/2004 | Nagatani et al. | 375/296 |
| 6,901,039 B1 | 5/2005 | Sugie et al. | |
| 6,901,514 B1 | 5/2005 | Iu et al. | |
| 6,903,604 B2 | 6/2005 | Kim | |
| 6,914,943 B2 | 7/2005 | Shimizu | |
| 6,975,688 B2 * | 12/2005 | Rexberg et al. | 375/297 |
| H2143 H * | 2/2006 | Prockup | 360/31 |
| 7,010,276 B2 | 3/2006 | Sander et al. | |
| 7,010,280 B1 * | 3/2006 | Wilson | 455/126 |
| 7,012,969 B2 | 3/2006 | Ode et al. | |
| 7,054,385 B2 * | 5/2006 | Booth et al. | 375/300 |
| 7,109,791 B1 | 9/2006 | Epperson et al. | |
| 7,113,551 B2 | 9/2006 | Sills et al. | |
| 7,158,494 B2 | 1/2007 | Sander et al. | |
| 7,349,490 B2 | 3/2008 | Hunton | |
| 7,457,586 B1 | 11/2008 | Hietala et al. | |
| 7,529,523 B1 | 5/2009 | Young et al. | |
| 7,542,520 B1 * | 6/2009 | Estrada | 375/303 |
| 2001/0022532 A1 | 9/2001 | Dolman | |
| 2002/0021764 A1 | 2/2002 | Posti | |
| 2002/0041210 A1 | 4/2002 | Booth et al. | |
| 2002/0044014 A1 * | 4/2002 | Wright et al. | 330/2 |
| 2002/0060606 A1 * | 5/2002 | Andre | 330/149 |
| 2002/0093378 A1 | 7/2002 | Nielsen et al. | |
| 2002/0113905 A1 | 8/2002 | Lee | |
| 2002/0160821 A1 | 10/2002 | Kaikati et al. | |
| 2002/0167923 A1 | 11/2002 | Sendonaris et al. | |
| 2003/0020538 A1 | 1/2003 | Kim | |
| 2003/0087617 A1 | 5/2003 | Shohara | |
| 2003/0133518 A1 | 7/2003 | Koomullil et al. | |
| 2003/0161487 A1 | 8/2003 | Husted et al. | |
| 2003/0179830 A1 * | 9/2003 | Eidson et al. | 375/296 |
| 2003/0197558 A1 | 10/2003 | Bauder et al. | |
| 2003/0197559 A1 | 10/2003 | Ghannouchi et al. | |
| 2003/0215025 A1 | 11/2003 | Hietala | |
| 2003/0215026 A1 | 11/2003 | Hietala | |
| 2003/0227342 A1 | 12/2003 | Liu | |
| 2004/0072597 A1 | 4/2004 | Epperson et al. | |
| 2004/0121741 A1 | 6/2004 | Rashev et al. | |
| 2004/0131129 A1 | 7/2004 | Harron et al. | |
| 2004/0183511 A1 | 9/2004 | Dening | |
| 2004/0198414 A1 | 10/2004 | Hunton | |
| 2004/0208157 A1 | 10/2004 | Sander et al. | |
| 2005/0002470 A1 | 1/2005 | Saed et al. | |
| 2005/0018765 A1 | 1/2005 | Endres et al. | |
| 2005/0195919 A1 | 9/2005 | Cova | |
| 2006/0071711 A1 | 4/2006 | Persson et al. | |
| 2006/0203899 A1 | 9/2006 | Gee | |
| 2006/0280502 A1 | 12/2006 | Sekine et al. | |
| 2007/0110199 A1 | 5/2007 | Momtaz et al. | |
| 2007/0190952 A1 | 8/2007 | Waheed et al. | |
| 2008/0219332 A1 | 9/2008 | Brehler | |
| 2008/0310617 A1 | 12/2008 | Daecke et al. | |
| 2009/0252255 A1 * | 10/2009 | Lee et al. | 375/297 |

OTHER PUBLICATIONS

Andraka, Ray, "A Survey of CORDIC Algorithms for FPGA Based Computers," Association for Computing Machinery, 0-89791-978-5, 1998.

Johnson, Jackie, "Power Amplifier Design for Open Loop EDGE Large Signal Polar Modulation Systems," RFDesign, Jun. 2006, pp. 42-50.

Pinto et al., "Phase Distortion and Error Vector Magnitude for 8-PSK Systems," London Communications Symposium, Sep. 14-15, 2000, University College London, London, England.

Cusinato, Paolo, "Gain/Bandwidth Programmable PA Control Loop for GSM/CPRS Quad-Band Cellular Handsets," IEEE Journal of Solid-State Circuits, Jun. 2004, 960-966, vol. 39, No. 6, IEEE.

Volder, Jack E., "The CORDIC Trigonometric Computing Technique," IRE Trans. On Elect. Computers p. 330, Sep. 1959.

* cited by examiner

AM TO AM CORRECTION SYSTEM FOR POLAR MODULATOR

RELATED APPLICATIONS

The present application is related to concurrently filed, commonly assigned, commonly invented U.S. patent application Ser. No. 10/147,569, entitled "AM TO PM CORRECTION SYSTEM FOR POLAR MODULATOR."

FIELD OF THE INVENTION

The present invention relates to controlling a power amplifier, and more particularly to controlling the power amplifier in a manner to correct the output Error Vector Magnitude (EVM) and spectrum of the power amplifier.

BACKGROUND OF THE INVENTION

Transmitters form one half of most communication circuits. As such, they assume a position of prominence in design concerns. With the proliferation of mobile terminals, transmitter design has progressed in leaps and bounds as designers try to minimize components and reduce size, battery consumption, and the like. Likewise, modulation schemes are continuously updated to reflect new approaches to maximize information transfers in limited bandwidths. Changes in standards or standards based on newly available spectrum may also cause designers to approach modulating transmitters with different techniques.

Many different standards and modulation schemes exist, but one of the most prevalently used in the world of mobile terminals is the Global System for Mobile Communications (GSM). GSM comes in many flavors, not the least of which is General Packet Radio Service (GPRS). GPRS is a new non-voice value-added service that allows information to be sent and received across a mobile telephone network. It supplements today's Circuit Switched Data and Short Message Service. GSM allows many different types of mobile terminals, such as cellular phones, pagers, wireless modem adapted laptops, and the like, to communicate wirelessly through the Public Land Mobile Network (PLMN) to the Public Switched Telephone Network (PSTN).

One relatively recent change has been the advent of the Enhanced Data for GSM Evolution (EDGE) scheme in GSM systems. This system contains amplitude modulation components, and, as a result, the power amplifier must be linear, never operating in saturation if classical modulation techniques are employed. Such a system lacks the efficiency of one that operates the power amplifier in saturation.

If a polar modulation system is used instead of a classical modulation system, then the power amplifier may operate in saturation and efficiency would be greatly improved. In addition, if the polar signals are generated by a digital method, such a system does not require the use of a high current drain quadrature modulator. Quadrature modulators are undesirable from a design standpoint in that they draw large amounts of current, and hence, drain batteries comparatively fast.

Analog components cause design problems for polar modulators in that the phase and amplitude signals must be aligned so that they arrive at the power amplifier at the desired time. Because of path variations with variable time delay analog components, this time aligning is difficult to achieve. Any solution to controlling the power amplifier should be able to eliminate or reduce reliance on a quadrature modulator and provide digital components such that time alignment is comparatively easy to do.

Unfortunately, further complicating matters, the amplitude signal that controls the power amplifier will cause unwanted phase components to be created in the output of the power amplifier due to the non-linearities of the power amplifier. This is sometimes called AM to PM conversion, and it degrades the spectral purity of the system and the Error Vector Magnitude. Thus, a need also exists to be able to counteract or eliminate the unwanted AM to PM conversion signal from the transmitted phase signal.

An additional concern is that the power amplifier may have a non-linear gain with varying output power. This may create what is called AM to AM conversion. The AM to AM conversion may have both phase and amplitude distortion components, and to create a better control system, these should be reduced or eliminated as well.

SUMMARY OF THE INVENTION

The present invention addresses concerns raised by the AM to AM conversion problems of the prior art by using a polar converter to generate an amplitude signal and a phase signal. The phase signal is converted to a frequency signal. The amplitude signal is directed to a compensator and a compensation signal is generated. The compensation signal is combined with the amplitude signal and the combined signal is presented to the power amplifier. AM to AM conversion is compensated for by the compensation signal such that the output of the power amplifier is substantially free of spurious components.

In an exemplary embodiment, the compensation signal is generated using a quadratic term, and a cubic term. Further, the compensation signal may be a piecewise function whose coefficients are selected by power levels associated with the power amplifier.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

While the present invention is particularly well-suited for use in a mobile terminal, and particularly a mobile terminal that is operating in an Enhanced Data for GSM Evolution (EDGE) scheme in a GSM system, it should be appreciated that the present invention may be used in other transmitters, either wireless or wirebased, as needed or desired.

Figure 1:
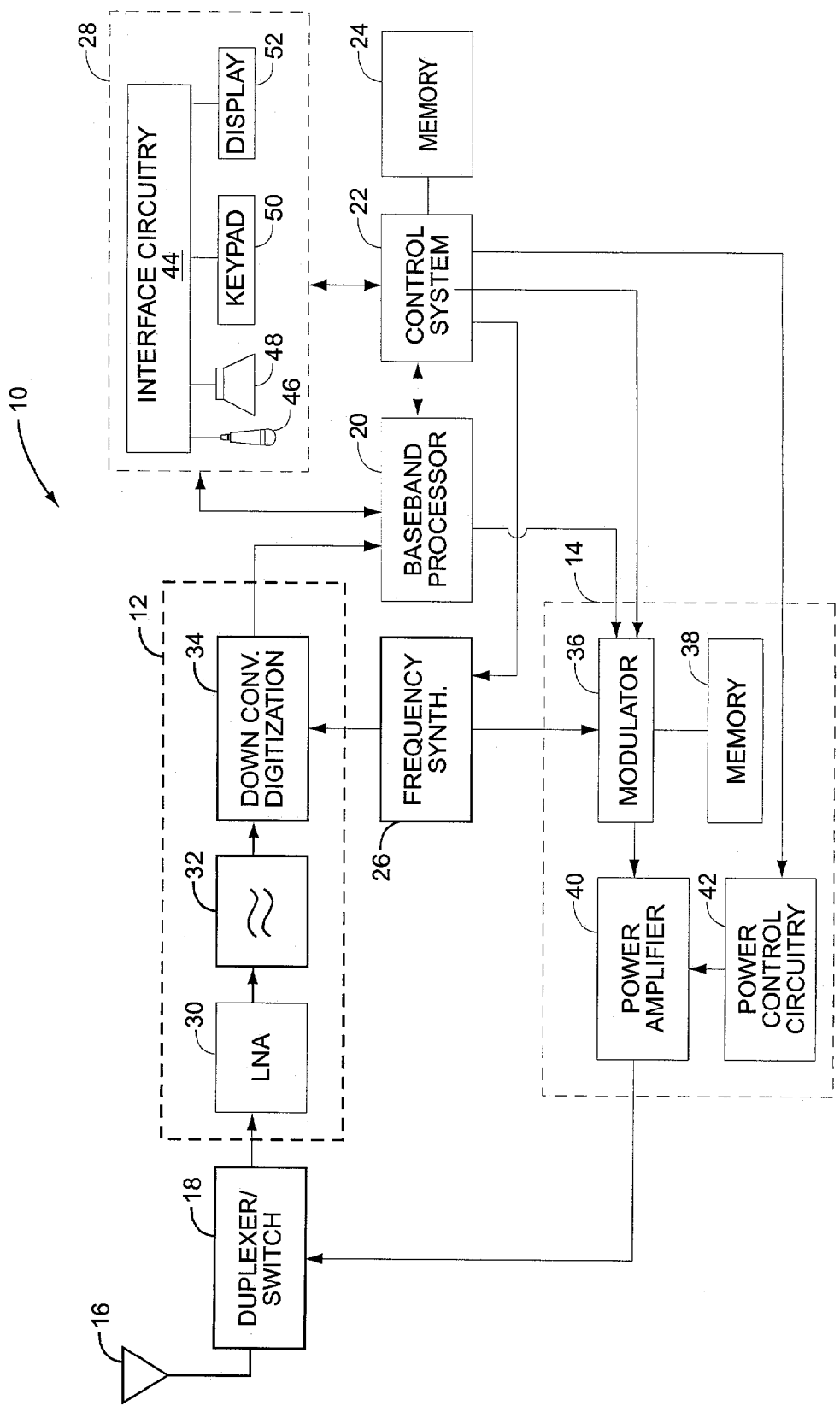
FIG. 1 illustrates an exemplary mobile terminal such as may use the present invention.

The present invention is preferably incorporated in a mobile terminal 10, such as a mobile telephone, personal digital assistant, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 36 to modulate a carrier signal that is at a desired transmit frequency. The modulator 36 may have an optional memory unit 38 associated therewith. Power amplifier 40 amplifies the modulated carrier signal to a level appropriate for transmission from the antenna 16.

As described in further detail below, the power amplifier 40 provides gain for the signal to be transmitted under control of the power control circuitry 42, which is preferably controlled by the control system 22. Memory 24 may contain software that allows many of these functions to be run. Alternatively, these may be a function of sequential logic structures as is well understood.

A user may interact with the mobile terminal 10 via the interface 28, which may include interface circuitry 44 associated with a microphone 46, a speaker 48, a keypad 50, and a display 52. The interface circuitry 44 typically includes analog-to-digital converters, digital-to-analog converters, amplifiers, and the like. Additionally, it may include a voice encoder/decoder, in which case it may communicate directly with the baseband processor 20.

The microphone 46 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 48 by the interface circuitry 44. The keypad 50 and display 52 enable the user to interact with the mobile terminal 10, input numbers to be dialed and address book information, or the like, as well as monitor call progress information.

While the present invention is well-suited for incorporation into a mobile terminal, such as the mobile terminal 10 just described, the present invention is also well-suited for use in wireless transmitters associated with wireless LANs and the like. As such, the present invention is not limited to a particular apparatus.

Figure 2:
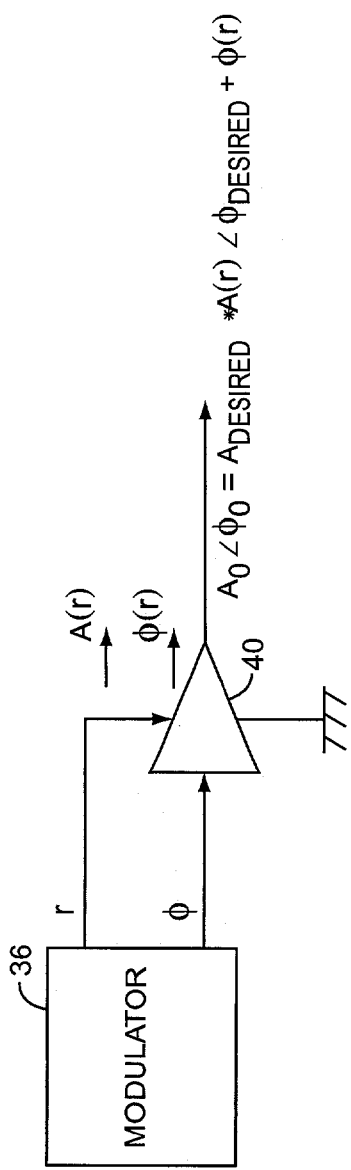
FIG. 2 illustrates a block diagram of a prior art modulation scheme.

In the past, as illustrated in FIG. 2, the modulator 36 directs two signals to the power amplifier 40. In an exemplary prior art embodiment, a polar modulator 36 directed an amplitude signal (r) and a phase signal ($\phi$) to the power amplifier 40. The amplitude signal (r) controlled the power supply voltage of the power amplifier 40, potentially replacing or including the power control circuitry 42, while the phase signal ($\phi$) was amplified by the power amplifier 40 to create $A_{DESIRED} \angle \phi_{DESIRED}$. The output ($A_O \angle \phi_O$) of the power amplifier 40 was corrupted by AM to PM conversion within the non-linear power amplifier 40, represented by $\phi(r)$, and AM to AM conversion, represented by $A(r)$, resulting in an output signal of $A_{DESIRED} * A(r) \angle \phi_{DESIRED} + \phi(r)$.

Figure 3:
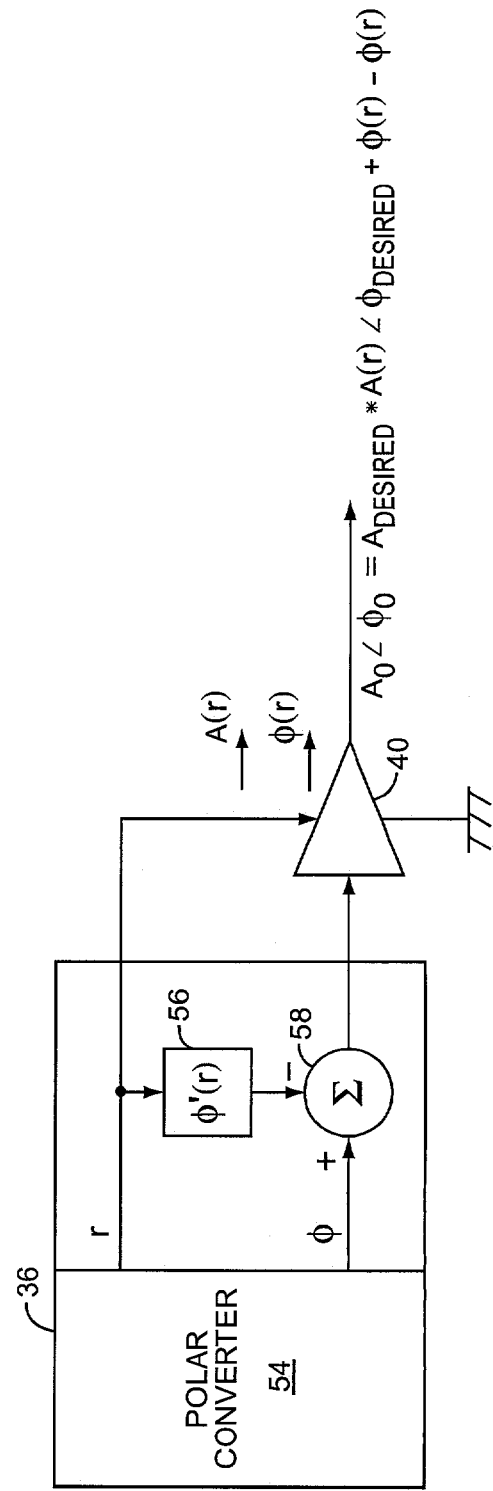
FIG. 3 illustrates a block diagram of an exemplary embodiment of the present invention.

The present invention corrects the AM to PM conversion within the output by preliminarily distorting the phase signal such that when it is converted to a frequency signal and amplified by the power amplifier 40, the predistortion element cancels the AM to PM conversion distortion element introduced by the amplitude signal (r). This is illustrated in a simplified format in FIG. 3, wherein the amplitude signal (r) is split by a polar converter 54 within the modulator 36 and directed to a compensator 56, where a predistortion signal $\phi'(r)$ is generated and then negatively added to the phase signal by an adder 58. The combined signal ($\phi - \phi'(r)$), expressed as an equivalent frequency signal, is amplified by the power amplifier 40. The power amplifier 40 imposes a transfer function upon the combined signal and generates $\phi_{DESIRED} - \phi(r)$ from the combined signal. The distortion of the amplitude signal is added, and the $\phi(r)$ terms cancel out, leaving $A_{DESIRED} * A(r) \angle \phi_{DESIRED}$.

Figure 4:
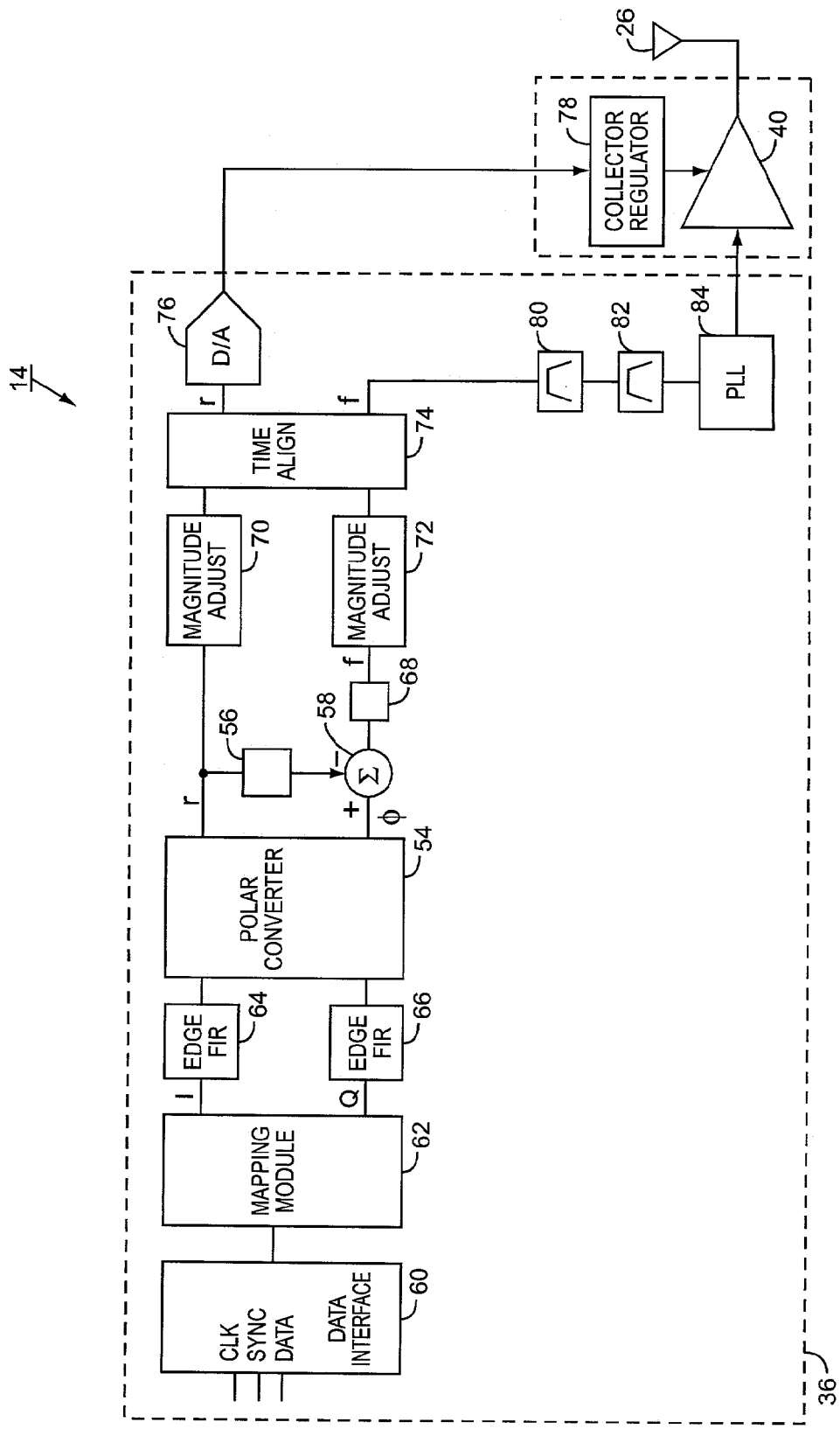
FIG. 4 illustrates a transmitter chain embodying the present invention.

More specifically, the present invention may be situated in the radio frequency transmitter section 14, as better illustrated in FIG. 4. Specifically, the radio frequency transmitter section 14, and particularly the modulator 36, may include several components, including a serial interface 60, a mapping module 62, first and second filters 64, 66, and the aforementioned polar converter 54. Other components of the modulator 36 will be discussed below.

The serial interface 60 receives Non-Return to Zero (NRZ) serial data from the baseband processor 20 at the bit rate of the system. NRZ data may be a 1B1B code with one line bit for each associated binary bit. In an exemplary embodiment, the modulation scheme for the modulator 36 uses an EDGE modulation scheme, and thus, the bit rate is 812.5 kbps. This data is passed to the mapping module 62, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an I, Q constellation.

Both the I and the Q components for each point are then filtered by the first and second filters 64, 66 respectively. In an exemplary embodiment, the first and second filters 64, 66 are EDGE finite impulse response (FIR) filters. This, as dictated by the ETSI specifications, shapes the response between symbol times.

After filtering, both the I and Q components are sent to the polar converter 54. The polar converter 54 uses a classical CORDIC (coordinate rotation digital computer) algorithm or like rectangular to polar conversion technique. Thus, the polar converter 54 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, February 22-24, pp. 191-200 and "The CORDIC Trigonometric Computing Technique" by Jack E. Volder *IRE Trans on Elect. Computers*, p. 330, 1959, both of which are hereby incorporated by reference in their entirety.

The amplitude signal (r) is split and directed to the compensator 56. The compensator 56 introduces a compensation term to the phase signal that, after further processing, counteracts the distortion introduced by the AM to PM conversion in the power amplifier 40.

The compensator 56 acts to create a sum of polynomials along the lines of the following equation:

$$\sum_{i=0}^{N} C_i (r(t))^i$$

In this particular case, N=3 and the equation expands to the following:

$$\phi'(r) = C_0 + C_1 r(t) + C_2 (r(t))^2 + C_3 (r(t))^3$$

$\phi'(r)$ is termed herein the compensation signal. It is readily apparent that $\phi'(r)$ has an offset term, a linear term, a quadratic term, and a cubic term selectable by the hardware implementation.

In an exemplary embodiment of the present invention, the coefficients $C_i$ are associated with the control system 22, and particularly in non-volatile memory 24 associated therewith. Alternatively, the coefficients may be stored in memory 38 if such is present. In an exemplary embodiment, the coefficients may be stored as a look up table. It is further possible that the coefficients are stored as a function of sequential steps performed by hardware. The coefficients are determined through a best fit analysis of a function that substantially matches the unamplified inverse of $\phi(r)$. In a more preferred embodiment, a piecewise function is created with each piece being determined by a given power level. This is done to improve the fit between the functions. For example, if only one set of coefficients were used, $\phi'(r)$ might not fit well at the ends or perhaps in the middle of the relevant range of values. By implementing a piecewise function, a good fit between the equations may be achieved throughout the curve of relevant values. In an exemplary embodiment, a set of coefficients is created for each 2 dBm power step. This corresponds to the power steps defined in the ETSI standards. To calculate the coefficients, a program such as MATHCAD may be used to derive a match to an empirical power amplifier curve. The coefficients may be tested through an ADS simulation or the like.

The output of the compensator 56 is subtracted from the phase signal ($\phi$) by the adder 58 to create a combined signal. The adder 58 is also termed herein a combiner. The output of the adder 58 (the combined signal) is directed to a phase to frequency converter 68 where the output is converted to a frequency signal (f). More detail on the phase to frequency converter 68 is provided below with reference to FIG. 5. After conversion to the frequency signal (f), magnitude adjusters 70, 72 then adjust the magnitude of the r and f signals to a level expected by the time aligner 74, such that they comply with the appropriate standard. Next, a relative time delay is applied as necessary to the signals for best Error Vector Magnitude (EVM) and spectrum by the time aligner 74. Because these are preferably digital components, concerns about variations in analog components and the corresponding variation in time delays downstream are minimized.

At this point, the r and f signals separate and proceed by different paths, an amplitude signal processing path and a frequency signal processing path, to the power amplifier 40. With respect to the amplitude signal processing path, the amplitude signal is converted to an analog signal by D/A converter 76. While not shown, a ramping function may be combined with the amplitude signal prior to digital-to-analog conversion. The output of the D/A converter 76 is used to set the collector voltage on the power amplifier 40 through a collector regulator 78. As the amplitude signal changes, the voltage at the power amplifier 40 collector changes, and the output power will vary as $V^2/R_{out}$ ($R_{out}$ is not shown, but is effectively the load on the power amplifier 40). This is sometimes known as "plate modulation".

The frequency signal is directed to a digital filter 80, a digital predistortion filter 82, and a phase locked loop (PLL) 84, as is described in commonly invented, commonly owned U.S. patent application Ser. No. 10/139,560, filed May 6, 2002, entitled DIRECT DIGITAL POLAR MODULATOR, which is hereby incorporated by reference in its entirety. The PLL 84 generates an output at the desired radio frequency. In an exemplary embodiment, the frequency signal is applied to a single port on a fractional N divider within the PLL 84.

In general, the PLL 84 comprises a reference source that is fed to a phase comparator. The phase comparator compares the edges of the reference source to the output of the fractional N divider and produces a correction signal. The correction signal is low pass filtered and input to a voltage controlled oscillator (VCO). The VCO outputs a frequency modulated signal at the RF carrier, which in turn is fed back to the fractional N divider. The divisor of the fractional N divider is modulated by the frequency signal. Further information on fractional N PLLs, how to modulate a signal by varying the fractional N divider, and the like may be found in U.S. Pat. Nos. 6,359,950; 6,236,703; 6,211,747; 5,079,522; 5,055,802; and 4,609,881 which are hereby incorporated by reference in their entireties.

Figure 5:
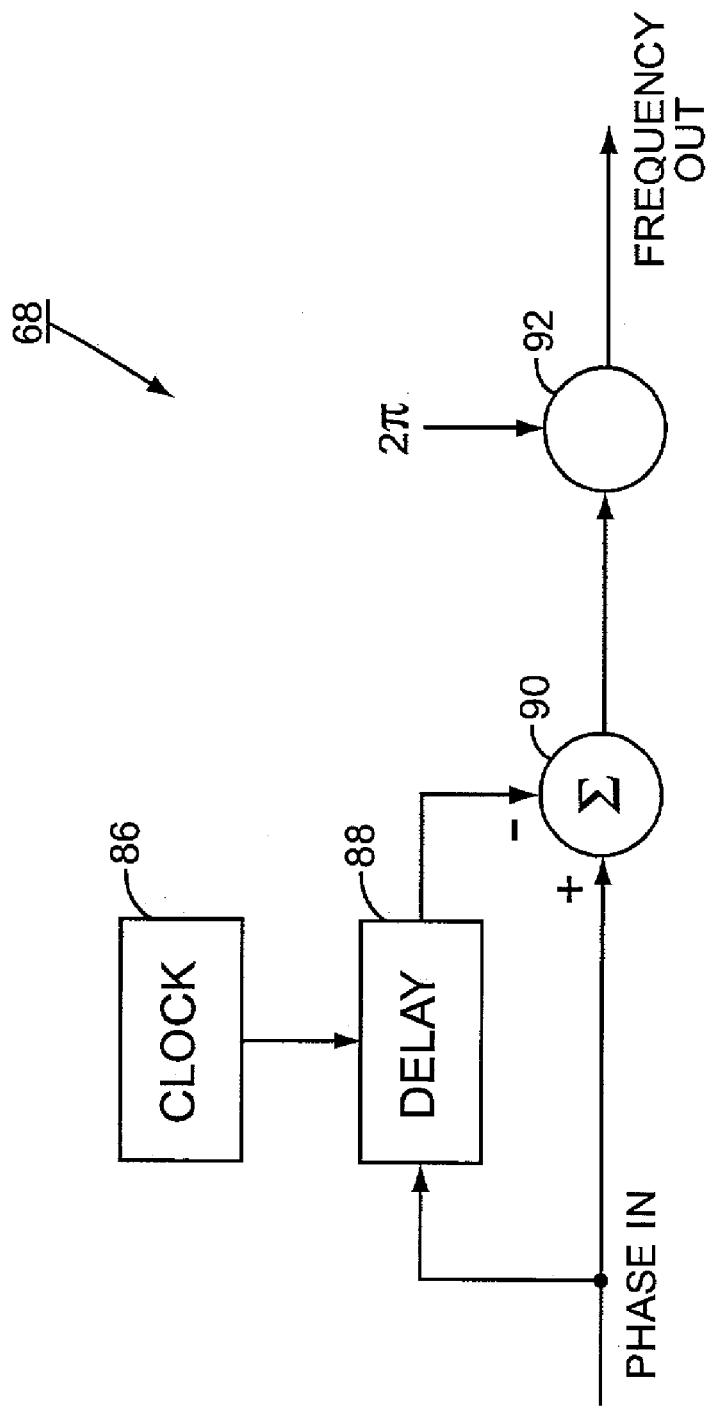
FIG. 5 illustrates a block diagram of a phase to frequency conversion process.

The phase to frequency converter 68 is explicated with reference to FIG. 5. The phase signal arrives and is split into a delay path and a normal path. A clock 86 controls a delay element 88 in the delay path. The output of the delay element 88 is subtracted from the normal path by adder 90. The output of the adder 90 is multiplied by $2\pi$ in a multiplier 92, and a frequency signal (f) is output. This structure takes advantage of the relationship $$f = 2\pi \frac{d(\text{phase})}{dt}$$

in a digital sense. The delay and the subtraction approximates the derivative as (phase(N)−phase(N−1))/T, where T is the period for the clock 86. Other phase to frequency conversions could also be used if needed or desired.

It is interesting to note that this derivative function causes the offset term of the sum of polynomials to be a zero value. However, this does cause an impulse function at the point where the constant is introduced. That is, when the constant changes from one constant to another, such as at the boundary of a piece of the piecewise function, there is effectively a square wave transition. At that point, there would be an instantaneous frequency change. This may create a desired phase offset at the output of the power amplifier 40. This is particularly useful in a General Packet Radio Service (GPRS) system to avoid phase discontinuities when power levels are switched.

Figure 6:
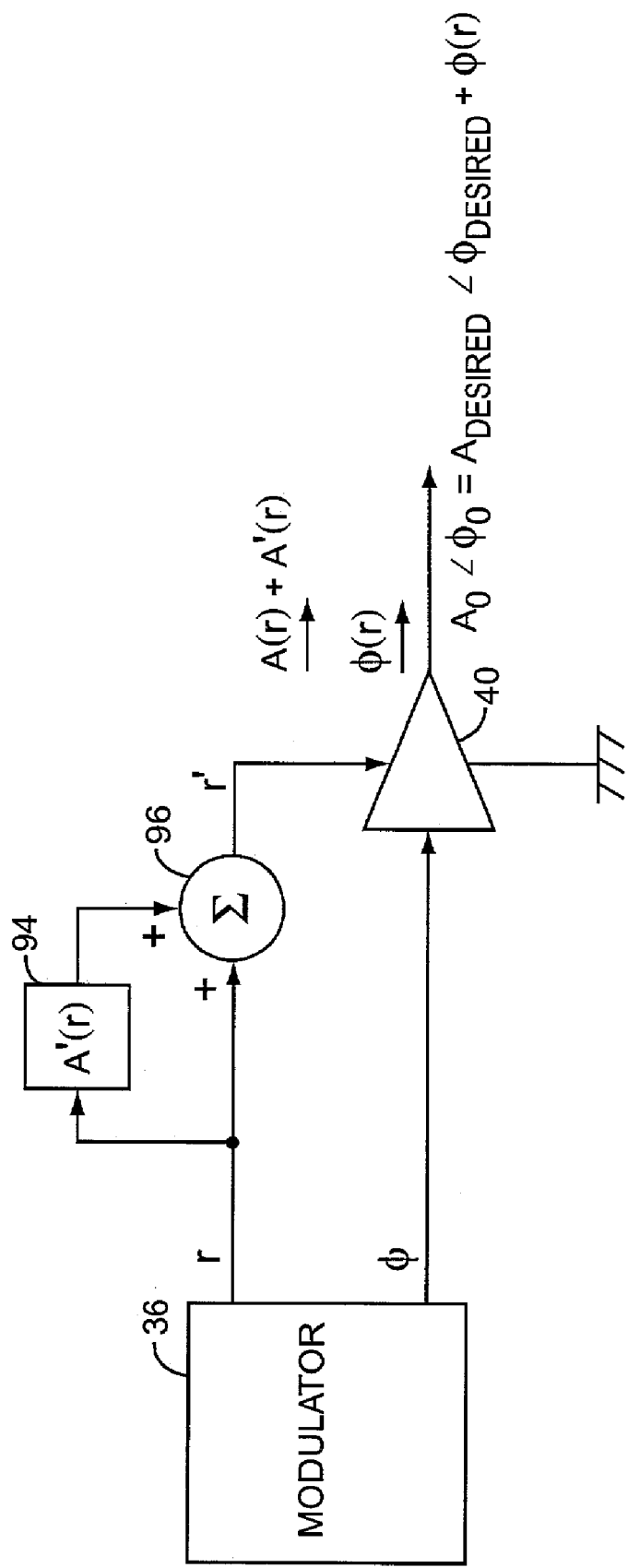
FIG. 6 illustrates a block diagram of a second exemplary embodiment of the invention.
Figure 7:
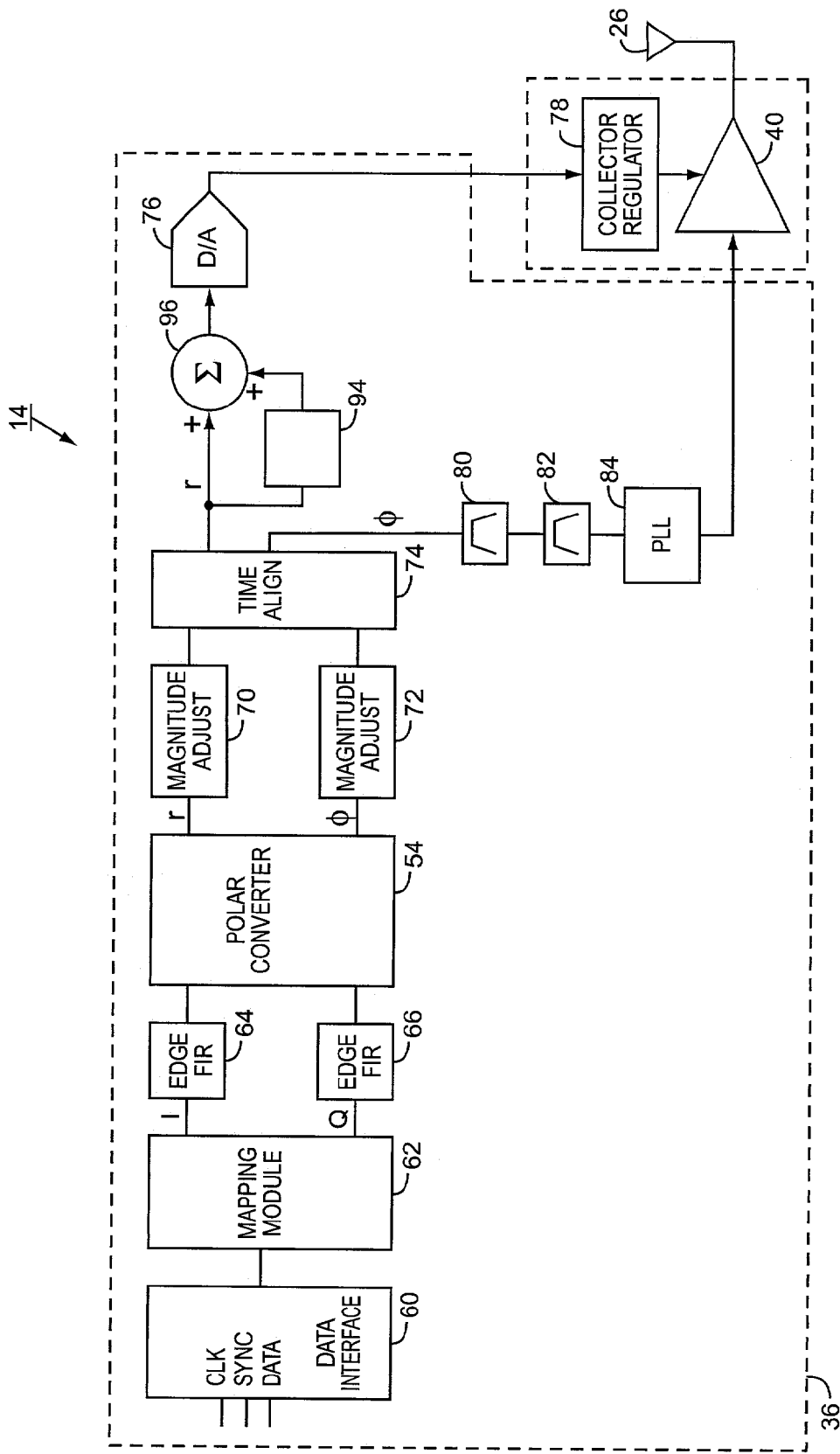
FIG. 7 illustrates a transmitter chain incorporating the second embodiment.

In a somewhat related embodiment, illustrated in FIGS. 6 and 7, instead of introducing the compensation signal into the phase signal to correct AM to PM conversion, the compensation signal may be introduced into the amplitude signal to correct AM to AM conversion. As noted above, AM to AM conversion (A(r)) is caused by the power amplifier 40 having non-linear gain with varying output power. FIG. 6 illustrates, in a very simplified form, the concept of this embodiment of the present invention. The amplitude signal is split and sent to a compensator 94. The compensator 94 generates a compensation signal A'(r) which is then added back to the amplitude signal by adder 96. When the amplitude signal (r) and the compensation signal A'(r) are introduced at the power supply input of the power amplifier 40, AM to AM conversion caused by the non-linearities gain of the power amplifier 40 is canceled, and the desired output signal $A_{DESIRED} \angle \phi_{DESIRED}$ is generated, albeit still corrupted by the AM to PM conversion $\phi(r)$.

FIG. 7 represents a more detailed view of how the compensator 94 fits within the modulator 36. In essence, the majority of the circuit functions like the circuit of FIG. 4. Compensator 94 acts to create a sum of polynomials along the lines of the following equation:

$$A'(r) = \sum_{i=0}^{N} C_i (r(t))^i$$

In this particular case, N=3 and the equation expands to the following:

$$A'(r) = C_0 + C_1 r(t) + C_2 (r(t))^2 + C_3 (r(t))^3$$

A'(r) is termed herein a compensation signal and r(t) is the amplitude of the modulation from the polar modulator 36. It is readily apparent that A'(r) has an offset term, a linear term, a squared term, and a cubic term. In an exemplary embodiment, the offset term $C_0$ and the coefficient for the linear term $C_1$ are zero. An offset term would act the same as increasing or decreasing the output power level. As the collector regulator 78 already addresses this, it is not necessary to repeat the control here. Likewise, a linear term would only change the fundamental amplitude and not change the shape of the curve, so a linear term for this compensation signal makes little sense.

When the exemplary embodiment A'(r) is combined with r(t) in the adder 96, the combined signal is:

$$r'(t) = r(t) + C_2 (r(t))^2 + C_3 (r(t))^3$$

which converts easily to the following:

$$r'(t) = r(t) * [1 + C_2 (r(t)) + C_3 (r(t))^2]$$

Thus, even though the adder 96 is an adder, the effect is to multiply the term r(t) by a correction factor that deviates from unity by A'(r). This signal then passes through the power amplifier 40 with AM to AM distortion. This distortion, as previously noted, is A(r). The goal is thus to make the term $[1+C_2(r(t))+C_3(r(t))^2]$ the inverse of the AM to AM distortion such that $A(r)*[1+C_2(r(t))+C_3(r(t))^2]=1$. When this condition is true, the AM to AM distortion has been canceled.

Alternatively, if the adder 96 were instead a multiplier, then the correction terms could have a linear term and an offset term. From a design standpoint, this removes a multiplier from the compensator 94 and inserts a multiplier in place of the adder 96. The concept of canceling the AM to AM conversion with its inverse remains the same.

In an exemplary embodiment of the present invention, the coefficients $C_i$ are associated with control system 22, and particularly in non-volatile memory 24 associated therewith. Alternatively, the coefficients may be stored in memory 38 if such is present. In an exemplary embodiment, the coefficients may be stored in a look up table or the like. It is further possible that the coefficients are created as a function of hardware. The coefficients are determined through a best fit analysis of a function that matches the expected AM to AM distortion A(r). In a more preferred embodiment, a piecewise function is created with each piece being determined by a given power level. This is done to improve the fit between the functions. For example, if only one set of coefficients were used, A'(r) might not fit well at the ends or perhaps in the middle of the relevant range of values. By implementing a piecewise function, a good fit between the equations may be achieved throughout the curve of relevant values. In an exemplary embodiment, a set of coefficients is created for each 2 dBm power step. This corresponds to the power steps defined in the ETSI standards.

To calculate the coefficients, a program such as MATHCAD may be used to derive a match to an empirical power amplifier curve. The coefficients may be tested through an ADS simulation or the like.

Figure 8:
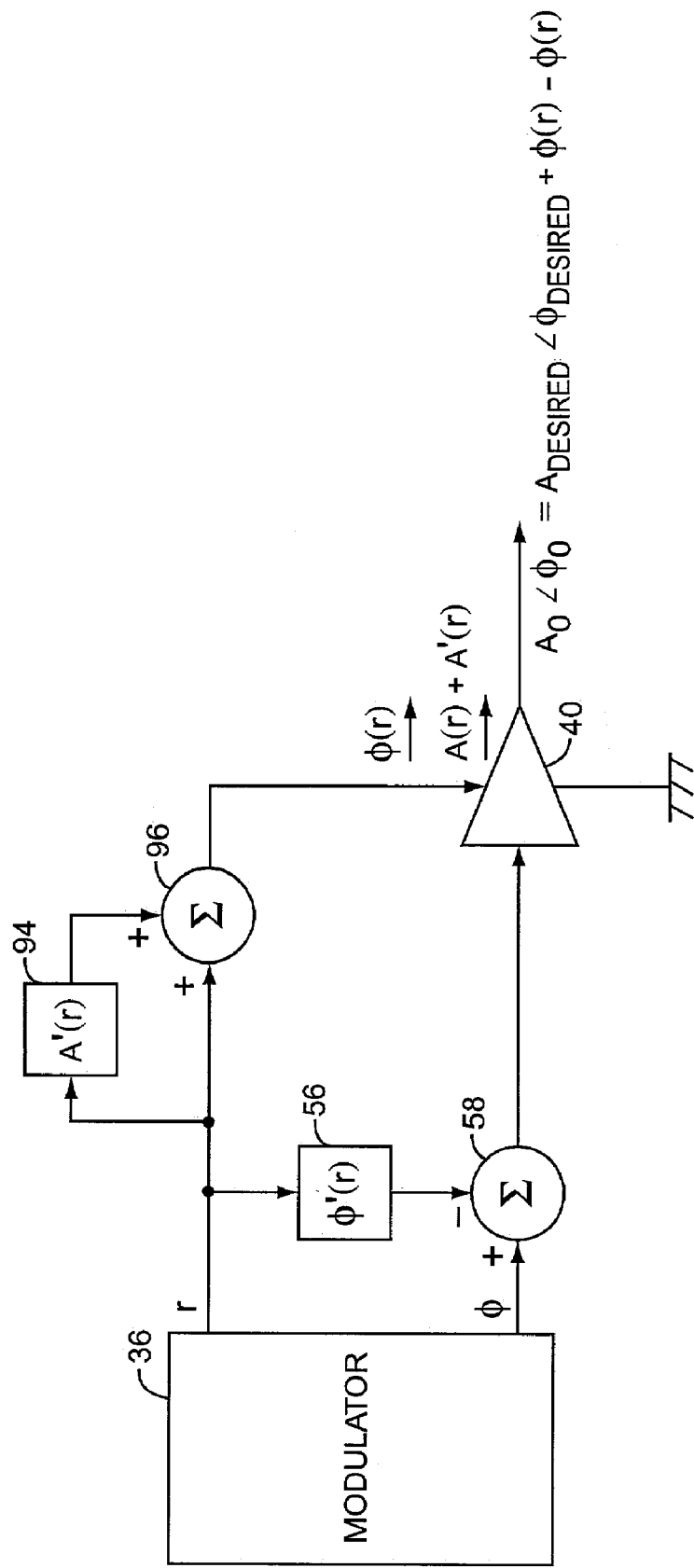
FIG. 8 illustrates a block diagram of a third exemplary embodiment of the present invention.

In yet another embodiment, illustrated in FIG. 8, both compensation schemes may be used simultaneously, although it should be noted that the functions now provide some interaction therebetween so that together both the AM to PM conversion and the AM to AM conversion is canceled.

Those skilled in the art will recognize improvements and modifications to the preferred embodiments of the present invention. All such improvements and modifications are considered within the scope of the concepts disclosed herein and the claims that follow.

What is claimed is:
1. A transmitter comprising:
   a polar converter adapted to convert a signal to a phase signal and an amplitude signal;
   a first compensator adapted to receive the amplitude signal and distort the amplitude signal such that a first compensation signal is generated;
   a first combiner adapted to combine the first compensation signal with the amplitude signal to create a power supply input signal;
   a second compensator adapted to receive the amplitude signal and distort the amplitude signal, such that a second compensation signal is generated;
   a second combiner adapted to combine the second compensation signal with the phase signal to produce a combined signal;

a converter adapted to convert the combined signal to a frequency signal; and an amplifier adapted to receive the power supply input signal and a signal based on the frequency signal and generate an output signal, wherein distortion of the output signal caused by the amplitude signal is at least partially canceled by the first compensation signal and the second compensation signal, said second compensation signal generated with a piecewise function associated with a plurality of different power levels within an overall operating range of the amplifier, such that each piece of the piecewise function is based on a corresponding set of at least two coefficients, which are based on a function that substantially matches an inverse of the phase signal over a corresponding one of the plurality of different power levels, and transitioning between two pieces of the piecewise function causes a frequency jump of the frequency signal to at least partially compensate for a phase shift in the power amplifier resulting from transitioning between two of the plurality of different power levels corresponding to the two pieces of the piecewise function.

2. The transmitter of claim 1 wherein said second combiner comprises an adder.

3. The transmitter of claim 1 wherein said second combiner comprises a multiplier.

4. The transmitter of claim 3 wherein the piecewise function comprises a quadratic term and a cubic term associated with each corresponding set of at least two coefficients.

5. The transmitter of claim 1 further comprising a digital-to-analog converter adapted to receive the power supply input signal and convert the power supply input signal to an analog signal.

6. The transmitter of claim 1 wherein the piecewise function comprises a linear term, a quadratic term, and a cubic term associated with each corresponding set of at least two coefficients.

7. The transmitter of claim 1 wherein each corresponding set of at least two coefficients is stored in a look up table.

8. The transmitter of claim 1 wherein the piecewise function includes at least three of an offset term, a linear term, a quadratic term, and a cubic term associated with each corresponding set of at least two coefficients.

9. The transmitter of claim 1 wherein the piecewise function comprises an offset term, a linear term, a quadratic term, and a cubic term associated with each corresponding set of at least two coefficients.

10. A method of controlling a transmitter, comprising:
generating a phase signal and an amplitude signal;
determining a power level of a power amplifier;
generating a first compensation signal from the amplitude signal;
generating a second compensation signal with a piecewise function from the amplitude signal, wherein the piecewise function is associated with a plurality of different power levels within an overall operating range of the power amplifier, such that each piece of the piecewise function is based on a corresponding set of at least two coefficients, which are based on a function that substantially matches an inverse of the phase signal over a corresponding one of the plurality of different power levels;
combining the first compensation signal with the amplitude signal to create a power supply input signal;
combining the second compensation signal with the phase signal to create a combined signal;
converting the combined signal to a frequency signal;
transitioning between two pieces of the piecewise function to cause a frequency jump of the frequency signal to at least partially compensate for a phase shift in the power amplifier resulting from transitioning between two of the plurality of different power levels corresponding to the two pieces of the piecewise function; and
amplifying the frequency signal with the power amplifier such that the compensation signal and non-linearity induced distortion of an output signal caused by the amplitude signal cancel one another, leaving substantially only an amplified frequency signal.

11. The method of claim 10 wherein generating the phase signal and the amplitude signal comprises generating the phase signal and the amplitude signal with a polar converter.

12. The method of claim 10 wherein combining the second compensation signal with the amplitude signal comprises adding the second compensation signal to the amplitude signal.

13. The method of claim 10 wherein generating the second compensation signal comprises selecting each corresponding set of at least two coefficients from a look up table based on the power level of the power amplifier.

14. The method of claim 10 further comprising aligning the frequency signal and the amplitude signal in time such that the frequency signal and the amplitude signal arrive at the power amplifier at a desired time.

15. The method of claim 10 wherein combining the second compensation signal with the amplitude signal comprises multiplying the second compensation signal with the amplitude signal.

16. The method of claim 15 wherein generating the second compensation signal-comprises generating a quadratic term and a cubic term, wherein the quadratic term and the cubic term compose the piecewise function and are associated with each corresponding set of at least two coefficients.

17. The method of claim 10 wherein the piecewise function includes a linear term, a quadratic term, and a cubic term associated with each corresponding set of at least two coefficients.

18. The method of claim 10 wherein the piecewise function comprises a quadratic term and a cubic term associated with each corresponding set of at least two coefficients.

19. The method of claim 10 wherein the piecewise function comprises an offset term, a linear term, a quadratic term, and a cubic term associated with each corresponding set of at least two coefficients.

* * * * *